United States Patent
Divoux et al.

(10) Patent No.: US 7,794,610 B2
(45) Date of Patent: Sep. 14, 2010

(54) OPTICAL COMPONENTS AND PRODUCTION THEREOF

(75) Inventors: Claire Divoux, Grenoble (FR); Marie-Helene Vaudaine, Seyssins (FR); Thierry Enot, Villar Bonnot (FR)

(73) Assignee: Commissariat a l'Energie Atomique, Paris (FR)

( * ) Notice: Subject to any disclaimer, the term of this patent is extended or adjusted under 35 U.S.C. 154(b) by 956 days.

(21) Appl. No.: 10/583,719

(22) PCT Filed: Dec. 23, 2004

(86) PCT No.: PCT/FR2004/050758

§ 371 (c)(1),
(2), (4) Date: Jun. 20, 2006

(87) PCT Pub. No.: WO2005/069057

PCT Pub. Date: Jul. 28, 2005

(65) Prior Publication Data

US 2007/0137989 A1    Jun. 21, 2007

(30) Foreign Application Priority Data

Dec. 26, 2003  (FR) ................................ 03 51209

(51) Int. Cl.
*H01L 21/302*  (2006.01)
*B81C 1/00*  (2006.01)
*B81C 3/00*  (2006.01)

(52) U.S. Cl. .................. 216/2; 216/13; 216/22; 216/24; 216/62; 216/67; 216/79; 438/29; 438/53; 438/689; 438/719; 438/734; 438/924; 29/25.35; 29/DIG. 16

(58) Field of Classification Search .............. 216/24
See application file for complete search history.

(56) References Cited

U.S. PATENT DOCUMENTS 4,203,128 A   5/1980   Guckel et al.

(Continued)

FOREIGN PATENT DOCUMENTS

EP    1 338 912    8/2003

(Continued)

OTHER PUBLICATIONS

U.S. Appl. No. 10/583,718, filed Jun. 20, 2006, Charton et al.

(Continued)

*Primary Examiner*—Anita K Alanko
(74) *Attorney, Agent, or Firm*—Oblon, Spivak, McClelland, Maier & Neustadt, L.L.P.

(57) ABSTRACT

The invention relates to a method for making an actuation system for an optical component comprising:
  etching of a first face of a component, to form pads on it,
  etching of a second face of the component, to expose a membrane made of the same material as the pads,
  production of the actuation means of the pads and the membrane.

29 Claims, 10 Drawing Sheets

U.S. PATENT DOCUMENTS

| | | | |
|---|---|---|---|
| 5,357,825 A * | 10/1994 | Costello et al. | 74/490.07 |
| 5,629,790 A | 5/1997 | Neukermans et al. | |
| 6,108,121 A * | 8/2000 | Mansell et al. | 359/291 |
| 6,369,931 B1 | 4/2002 | Funk et al. | |
| 6,563,106 B1 * | 5/2003 | Bowers et al. | 250/216 |
| 6,577,427 B1 | 6/2003 | Gee et al. | |
| 7,336,412 B2 * | 2/2008 | Yang | 359/291 |
| 7,588,815 B2 * | 9/2009 | Morimoto | 428/119 |

FOREIGN PATENT DOCUMENTS

| | | |
|---|---|---|
| WO | 01 53872 | 7/2001 |
| WO | 01 92939 | 12/2001 |

OTHER PUBLICATIONS

U.S. Appl. No. 11/472,377, filed Jun. 22, 2006, Chappaz et al.

U.S. Appl. No. 10/584,202, filed Jun. 23, 2006, Divoux.

Bifano et al., "Continuous-Membrane Surface-Micromachined Silicon Deformable Mirror", Society of Photo-Optical Instrumentation Engineers, vol. 36, No. 5, pp. 1354-1359, May 1997.

Hammer et al., "Design and Fabrication of a Continuous Membrane Deformable Mirror", Proceedings of SPIE, vol. 4983, pp. 259-270, 2003.

Robert et al., "Lemicro Miroir Adaptatif: Un Micro Composant D'Optique Adaptative", Second Forum Ademis, pp. 161-165, 1997.

Divoux et al., "A Novel Electrostatic Actuator for Micro Deformable Mirrors: Fabrication and Test", Transducers, Solid-State Sensors, Actuators and Microsystems, $12^{th}$ International Conference Held on 2003, vol. 1, pp. 488-491, 2003.

Krishnamoorthy et al., "Statistical Performance Evaluation of Electrostatic Micro Actuators for a Deformable Mirror", SPIE, vol. 2881, pp. 35-44, 1992.

Yang et al., "Concept, Modeling and Fabrication Techniques for Large-Stroke Piezoelectric Unimorph Deformable Mirrors", Proceedings of SPIE, vol. 4983, pp. 271-278, 2003.

Yang et al., "A New Wafer-Level Membrane Transfer Technique for MEMS Deformable Mirrors", 2001.

* cited by examiner

OPTICAL COMPONENTS AND PRODUCTION THEREOF

TECHNICAL DOMAIN AND PRIOR ART

The invention relates to the domain of manufacturing optical components.

In particular, it is applicable to adaptive optics, in which reflecting membranes are mechanically deformed to correct the phase of a light beam.

It also relates to manufacturing of mechanical actuation means in order to make reflecting membranes or optical components.

An optical surface is deformed using a matrix of actuators bonded to a reflecting membrane.

Embodiments are known with a single mechanical and optical level, for example a reflecting membrane free to move with respect to a matrix of electrodes. Examples are given in document U.S. Pat. No. 6,108,121 and in the article by G. Robert et al. <<le micro-miroir adaptatif: un micro-composant d'optique adaptative (the adaptive micro-mirror: an adaptive optics micro-component)>>, Second Ademis Forum, 1997, p 161-165. This method with one level (both mechanical and optical) cannot decouple actuation of the optical surface. For example, it is often required to have a very flexible optical surface to correct the beam and a very rigid actuator to be able to operate at frequencies higher than 1 kHz to work in real time. A frequently difficult compromise has to be made if there is only one optical level.

Embodiments with two levels are also known in which one of these levels is optical, as described for example in the documents by R. Krishnamoorthy et al. <<Statistical performance evaluation of electrostatic micro-actuators for a deformable mirror>>, SPIE Vol. 2881, p. 35-44, and in the article by T. G. Bifano et al. <<Continuous-membrane surface-micromachined silicon deformable mirror>>, Optical Engineering, Vol. 36, p. 1354-1360, 1997. The actuator is made in a first mechanical level and the second mechanical level is used for optical correction. The two levels are connected through mechanical pads that can be made from the same material as the material used for the <<optical>> mechanical level (for example polysilicon), by surface technology, for example by MUMPS (Multi-User MEMS Processes) silicon oxide/polysilicon surface technology. This technology consists of a stack of conforming layers in which the last layer is the optical layer, the flatness of which is degraded by the lower layers and by the fact that pads are made from the same material.

The pads can also be made from a different material from that used in the <<optical>> mechanical level, by transfer of a thin membrane onto the actuators, for example as described in documents by J. A. Hammer et al. <<Design and fabrication of a continuous membrane deformable mirror>>, Proc. Of SPIE, Vol. 4985, p. 259-270, due to the use of an SOI substrate and indium pads, or by transfer of a membrane already comprising pads, due to the use of a double SOI substrate and bonding of these membranes on actuators (as described by C. Divoux et al. <<A novel electrostatic actuator for micro-deformable mirrors: fabrication and test>>), or using a membrane bonded to the piezoelectric actuators using an adhesive layer.

In all cases, problems of impressions of pads are observed on the optical side of the membrane, resulting in poor flatness or roughness.

Furthermore, the surfaces of the pads may sometimes be large, which then reduces the flexibility of the membrane.

Therefore, the problem that arises is to find new elements or means, particularly for mechanical activation, in order to make new optical components, particularly of the type mentioned above.

Another problem that arises is making components of the type mentioned above with small pad impressions and improved flatness and flexibility.

PRESENTATION OF THE INVENTION

More precisely, the invention relates to a method for manufacturing an actuation system or means or device comprising:

etching of a first face of a component, for example a semiconducting substrate, or a thin layer formed on the surface of such a semiconducting substrate, to form pads, etching of a second face of the component to make or to expose a membrane made of the same material as the pads, production of the actuation means of the pads and membrane.

The fact that one face of the initial component is etched first, followed by the other face, makes it possible to make the pads, and then a flexible or deformable membrane in only a fraction of the initial thickness of the component. The pads and the membrane form a uniform assembly.

Thus, the membrane and the pads may be thin, for example the total thickness may be less than 30 µm, or it may be between 5 µm and 15 µm.

Therefore, the invention can be used to make two-level optical components integral with each other; it is also used to make a very good quality optical level.

The component may be made from a semiconducting material or glass and it may be provided with a surface layer of semiconducting material or nitride in which the pads and membrane are etched.

It may also be of the SOI type, comprising a surface layer of silicon, an insulating layer and a substrate, the pads and the membrane being made in the surface layer of silicon.

It may also be a silicon substrate covered by an insulating layer and a layer of polysilicon or a silicon substrate covered by a nitride layer, the pads and the membrane being made in the insulating or polysilicon or nitride layer respectively.

According to another variant, it may be a silicon substrate doped on two sides, the membrane and the pads being made in portions that are doped differently from each other.

The actuation means may be of the electrical or magnetic or thermal type.

They may be partly formed directly on the pads, or they may be made on one substrate or another substrate, which is then assembled with the actuation system.

The invention also relates to a mechanical activation system for an optical component, comprising:

a membrane provided with pads formed integrally with the membrane on one of its faces, actuation means for the pads and the membrane.

The membrane that is flexible or that can be deformed by the actuation means and the pads may be made in a component like that mentioned above.

A system according to the invention may have the dimensions mentioned above and may be provided with reflecting means conferring optical properties upon it.

Preferably, the height/width ratio of the pads is less than 20.

DETAILED DESCRIPTION OF PARTICULAR EMBODIMENTS OF THE INVENTION

Figure 1:
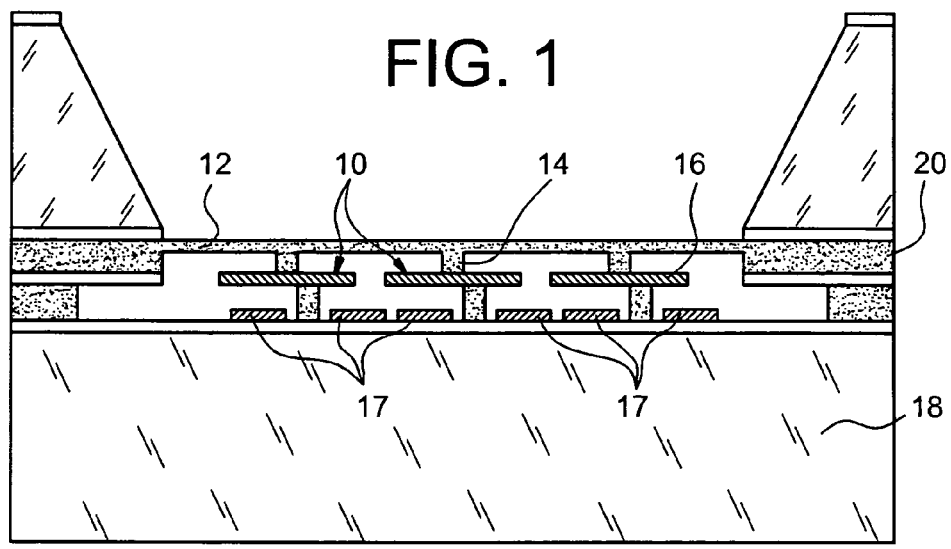
FIG. 1 is a cross-sectional view of a device according to an embodiment.
Figure 2:
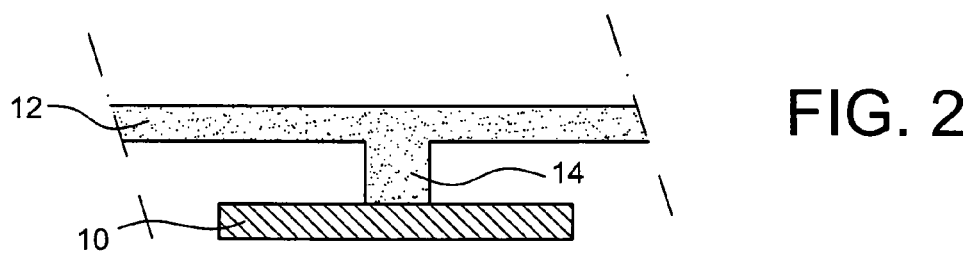
FIG. 2 is a magnified cross-sectional view of the device according to the embodiment.

A first embodiment of the invention is shown in FIGS. 1 and 2.

On these Figures, actuation means forming a first level 10 are coupled to a second level 12 by connecting pads 14.

The actuation means are used to move the pads and therefore to move the elements of this second level 12 connected to the pads.

For example, these actuation means are mobile electrodes 16 that act in combination with fixed electrodes 17 formed under the first level 10. As a variant, the actuator can also be composed of magnetic or thermal or piezoelectric means.

Figure 3:
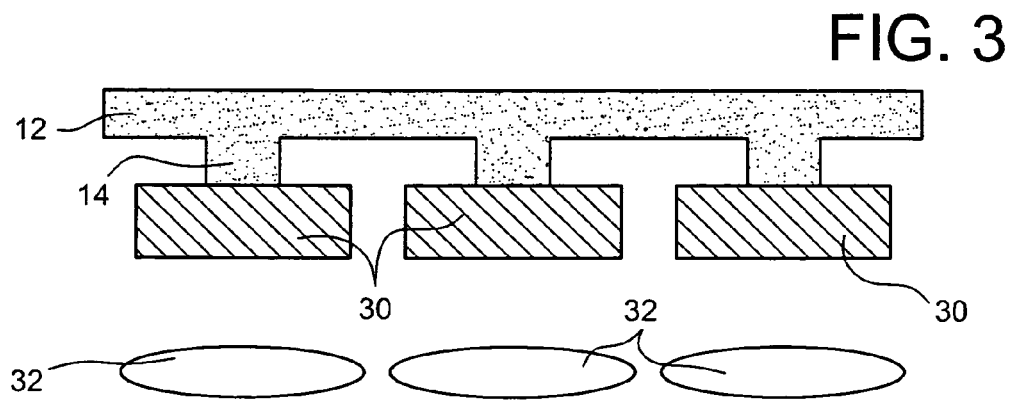
FIG. 3 is a cross-sectional view of an actuator of the device according to the embodiment.

In the case of magnetic actuation means, the mobile part of an actuator may be a magnet 30 or a coil bonded to a pad 14 with a fixed coil 32 or magnet facing it as shown in FIG. 3.

In the case of thermal or piezoelectric actuation means, the mobile part of an actuator may be a bimetallic strip structure made with a first layer and a second layer, the second layer having a greater coefficient of thermal expansion or greater expansion than the first layer. The fixed part may then be simply a surface onto which these structures bear.

In FIG. 1, the reference 20 denotes a thin layer, for example a silicon or germanium or indium phosphide (InP) layer, for example again of an SOI type substrate.

The assembly is supported on a substrate 18, for example made of silicon or glass.

The second mechanical level 12 and the connecting pads 14 are made from the same layer 20 without bonding or transfer. For example, this layer may have been manufactured in advance (by deposition, epitaxy or any other method) on a substrate with excellent flatness, for example flatness of a few μm over a substrate diameter of 100 mm or 200 mm; for example the roughness is less than 5 nm.

The initial substrate provides good flatness of the reflecting surface, due to this very good flatness. The uniformity of the material between the pads 14 and the level 12 assures that the optical surface is not degraded by differential expansion effects between the two materials. The lack of an interface between the pads 14 and this level 12 also limits degradations due to the manufacturing method.

Finally, as we will see later, the small thickness of the membrane 12—pads 14 assembly makes it possible to make a high quality component with defects, such as optical impressions, which are limited.

Therefore, the invention relates to a deformable or flexible membrane device provided with actuation means formed homogeneously with the membrane and used to deform this membrane.

Figure 4A:
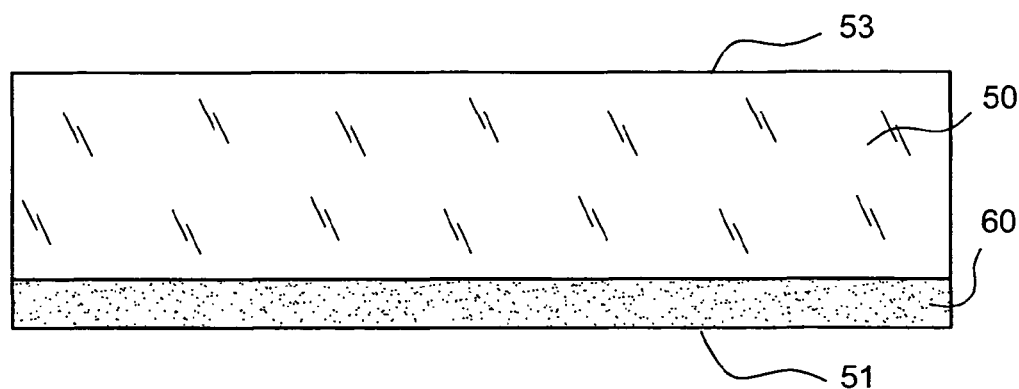
FIGS. 4A to 4E show steps in the production of the device according to an embodiment.
Figure 4B:
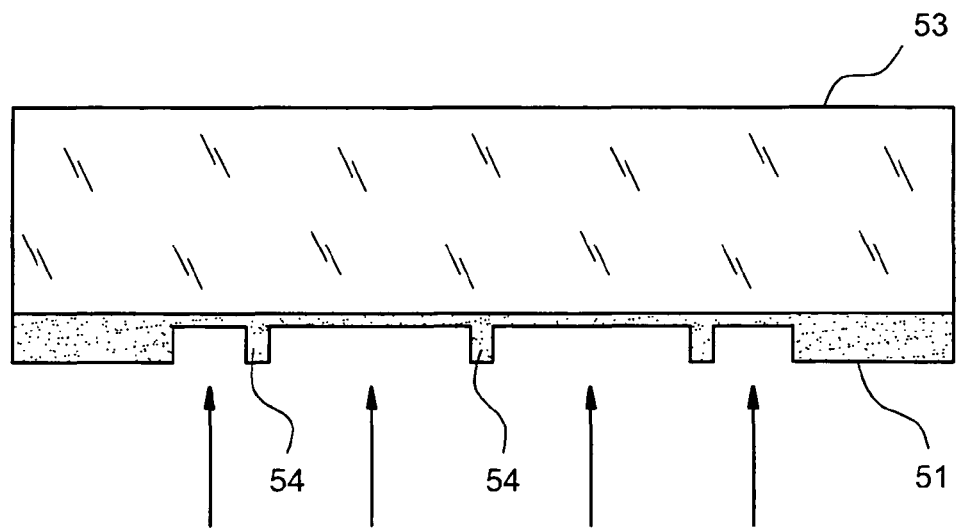
Figure 4C:
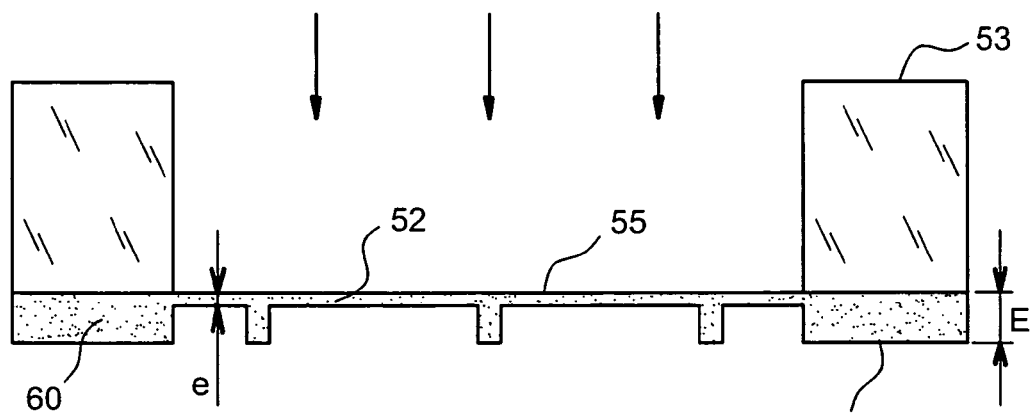

A method to make a system according to the invention may include the steps shown diagrammatically in FIGS. 4A-4C.

An initial component is a substrate 50 with a surface thin layer 60. The surface layer is thin, for example it may be between 10 μm and 30 μm.

The assembly may for example be an SOI substrate. An SOI (Silicon on Insulator) structure typically comprises a silicon layer under which a buried silicon oxide layer is formed that is itself supported on a silicon substrate that acts as mechanical support. For example, such structures are described in FR-2 681 472.

The substrate 50 may also be a silicon substrate covered by an insulator and a poly-silicon layer; it could also be a silicon substrate covered with nitride or a silicon substrate, or a substrate made of any other semiconducting material doped on both sides, or a glass substrate covered with nitride.

Pads 54 are etched in the layer 60, through one face of the initial component called the front face 51 (FIG. 4B).

Etching on the back face 53 then exposes a membrane 52 (FIG. 4C) in the layer 60. These two steps may also be done in the reverse order.

The result is thus a set of pads 54—membranes 52 made of a single material, the pads and the membrane being formed integrally and therefore with no assembly between them.

The layer in which the pads and the membrane 52 are formed has a thickness equal to E, for example between 5 μm and 20 μm or 30 μm. The thickness e of the membrane 52 alone is about 1 μm to 5 μm, so that it is very flexible and is free to deform.

Successive tests are used to determine an etching time in order to stop at the right depth. In the case of RIE etching or wet etching, a uniformity +/−5% can be obtained with current technologies.

A reflecting deposit can then be made on the external surface 55 of the membrane 52.

Figure 4D:
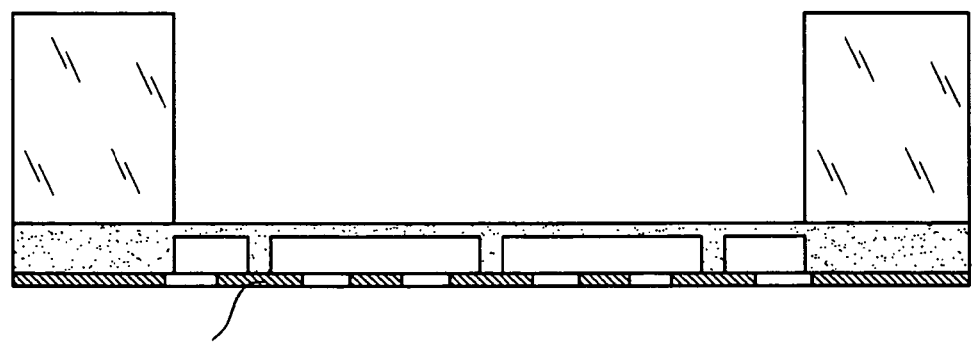

Activation means, or a first part of these means, and in this case, a layer 56 of mobile electrodes, can then be made directly on the substrate thus etched, for example using a sacrificial layer (FIG. 4D).

The assembly is then assembled with a substrate 58 (FIG. 4E) on which fixed electrodes 57 have been made. According to one variant, the mobile electrodes or the layer 56 of mobile electrodes can also be made on the same substrate as the fixed electrode.

Figure 5A:
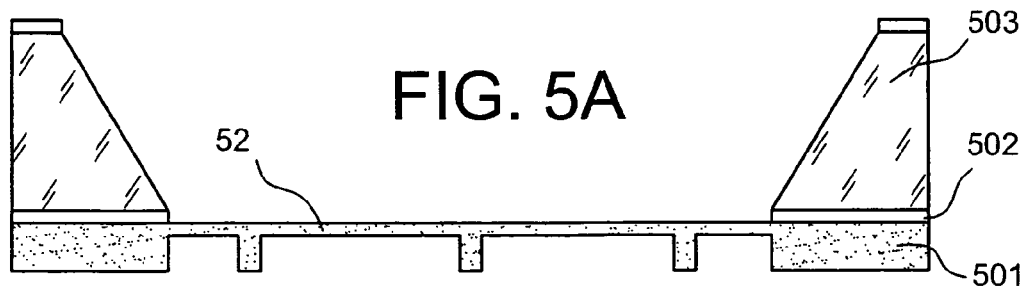
FIGS. 5A to 5B show steps in the production of the device according to the embodiment where the initial component is SOI.

FIG. 5A illustrates the embodiment that has just been described in the case in which the initial component is an SOI component comprising a thin layer 501 of silicon, a thin layer 502 of insulator (usually silicon dioxide) and a substrate 503 itself made of silicon. This structure enables etching of the pads and the surface 52 in the thin layer of silicon. As already explained above, the first step is to etch the pads 54, followed by etching of the substrate 503 to expose the membrane 52 (FIG. 5A).

The next step is to form a layer 56 of mobile electrodes directly on the layer 501.

Figure 4E:
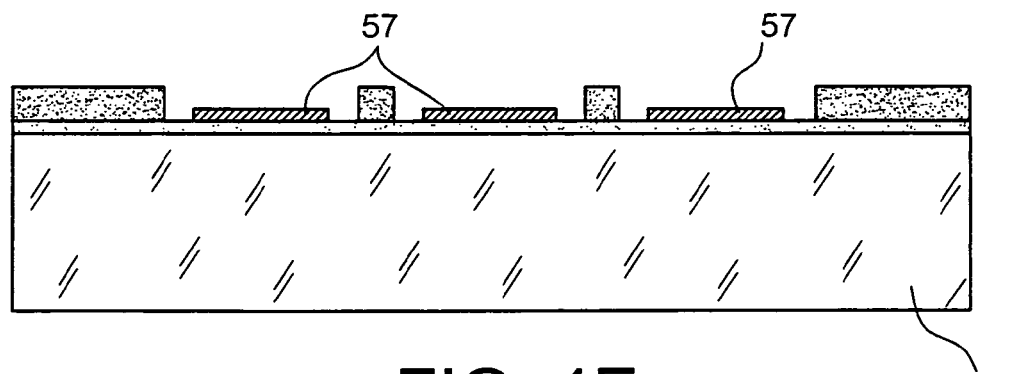
Figure 5B:
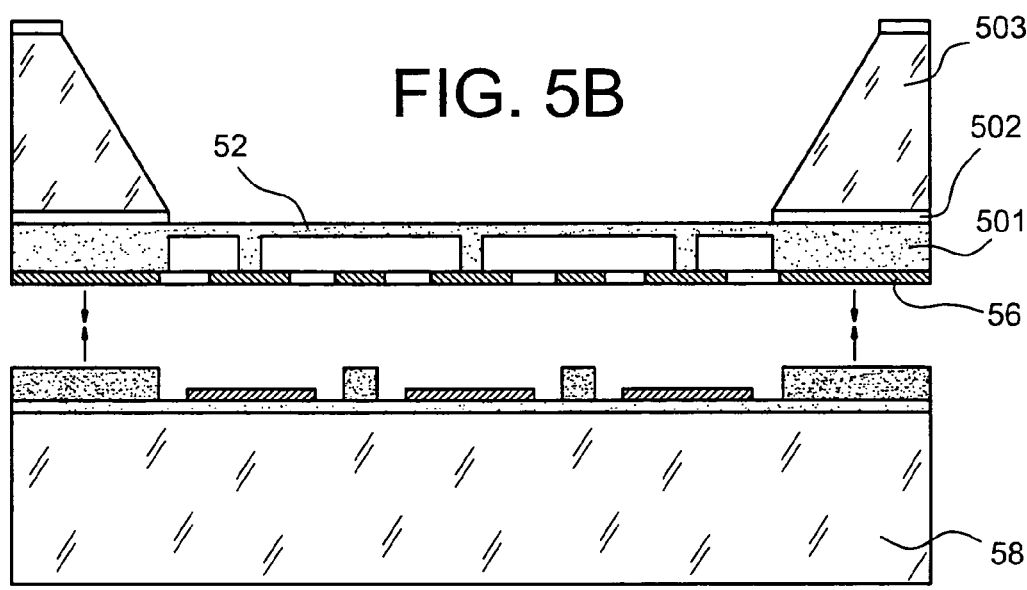

The assembly obtained shown in FIG. 5B may be assembled with a substrate like that shown in FIG. 4E.

Figure 6:
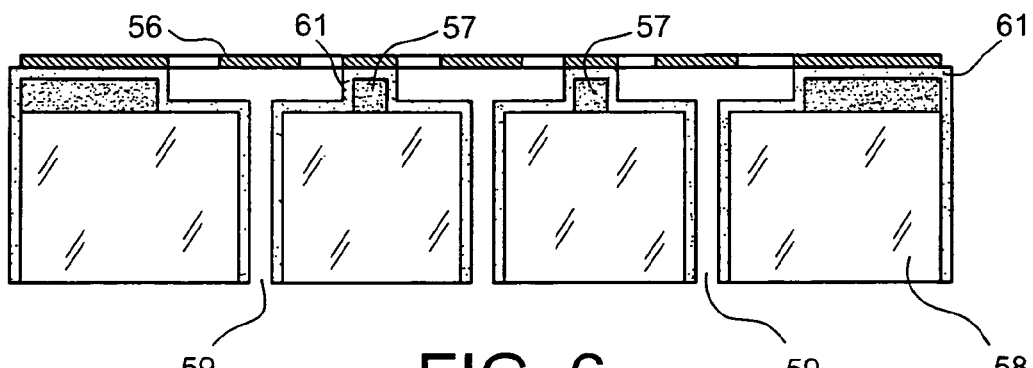
FIG. 6 shows a cross-sectional view of a variation of a structure of the device according to the embodiment depicted in FIG. 1.

According to one variant shown in FIG. 6, the layer 56 of mobile electrodes is made directly on a substrate 58, for example made of silicon or silicon nitride covered by a metal on which fixed electrodes 57 have already been made, as explained above with reference to FIG. 4E. The mobile electrodes are obtained by bonding a thin layer 56 (for example made of silicon or silicon nitride) on a substrate containing cavities; the vents 59 are used to balance pressures during the process and afterwards.

Reference 61 denotes a layer of means forming an electrical insulator, for example an electrical insulating layer, to separate the two levels of electrodes.

The structure in FIG. 5A can then be assembled with the structure in FIG. 6 to obtain the required component.

A detailed example of another embodiment will be described with reference to FIGS. 7A to 7J.

An SOI substrate 50 is used firstly to make part of the actuators (mobile electrode) and the optical membrane. This substrate 50 (FIG. 7A) comprises a layer of semiconducting material 501 (for example 15 µm thick silicon), an insulating layer 502 (for example 0.5 µm thick silicon dioxide) and a substrate made of a semiconducting material 503 (for example 500 µm thick silicon).

It is oxidised on the surface (insulating layers 60, 61, FIG. 7B) to form an etching mask.

The insulating layer 61 located on the back face is etched locally (FIG. 7C) to perform the subsequent etching step of the substrate 503 that will be used to define or expose the membrane.

The thin layer 503 is partially etched (for example over 10 µm by RIE etching) on the front face (FIG. 7D) to make connecting pads 54 between the activation means, for example mobile electrodes, and the optical membrane.

Figure 7A:
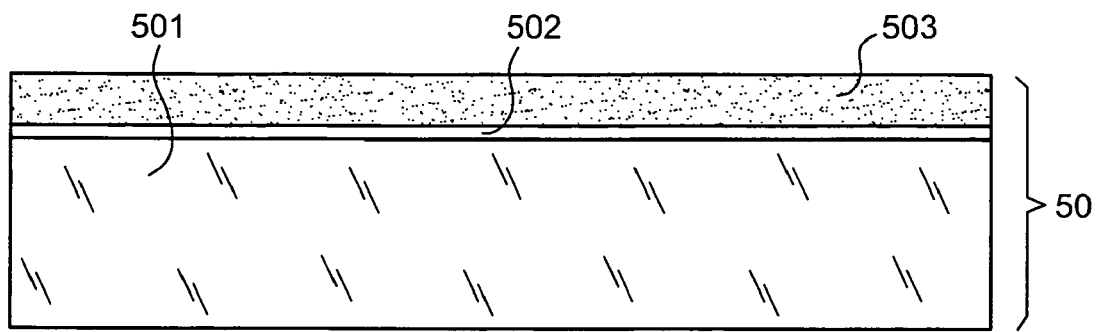
FIGS. 7A to 7J show steps in the production of the device according to another embodiment where the initial component is SOI.
Figure 7B:
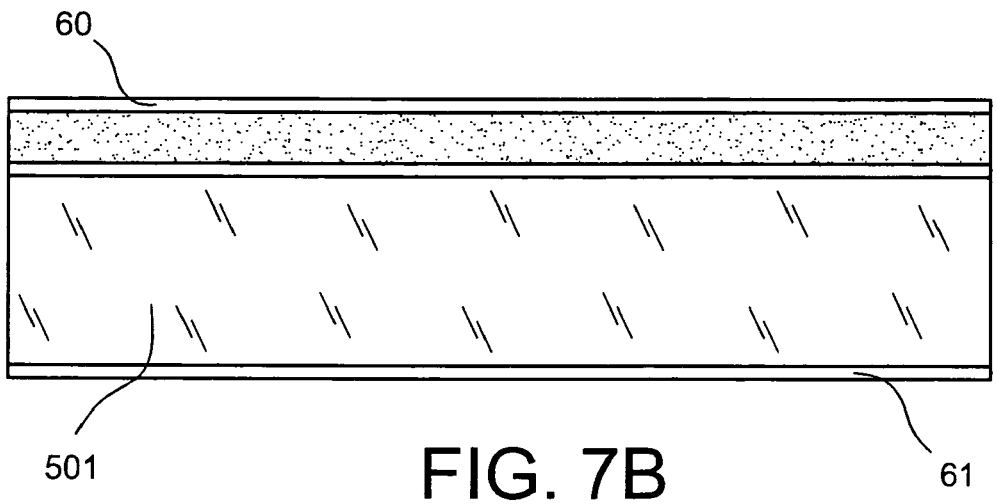
Figure 7C:
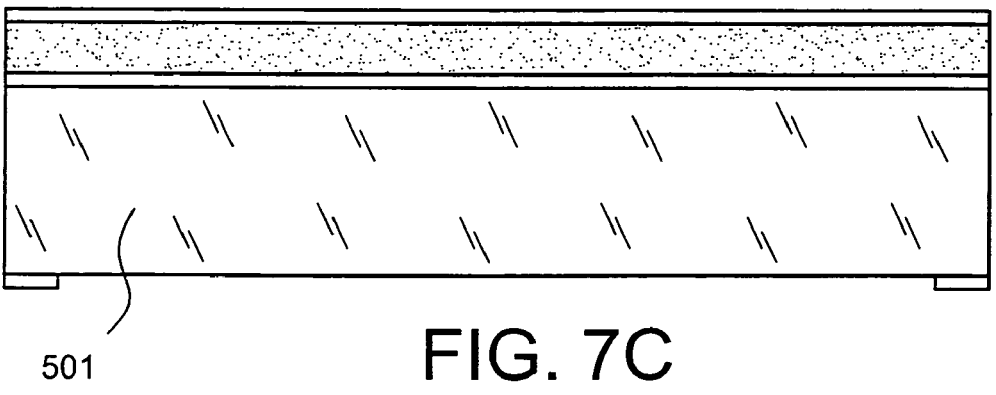
Figure 7D:
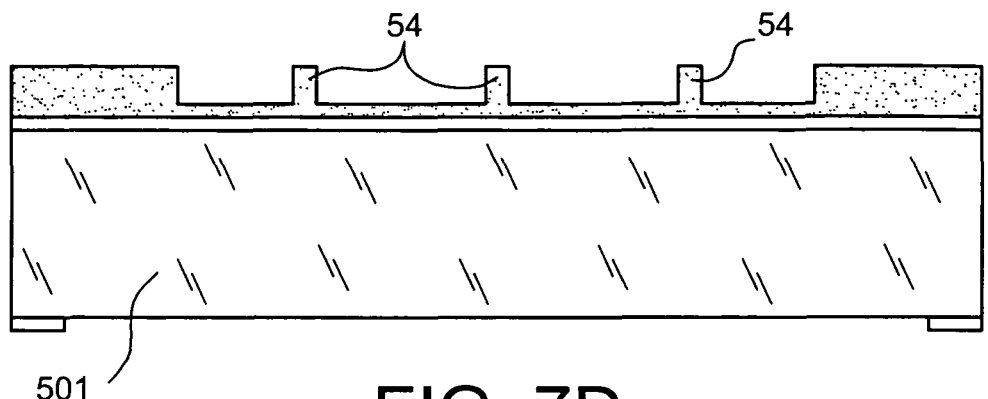
Figure 7E:
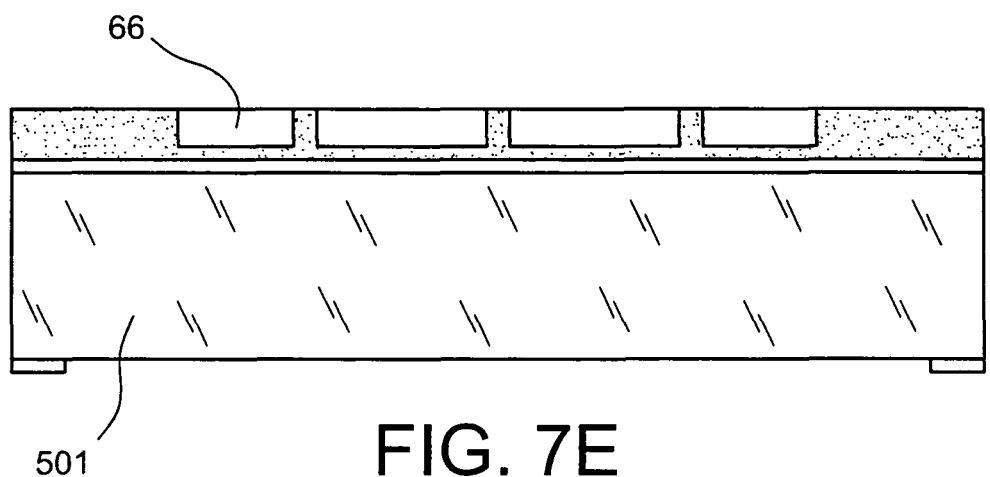
Figure 7F:
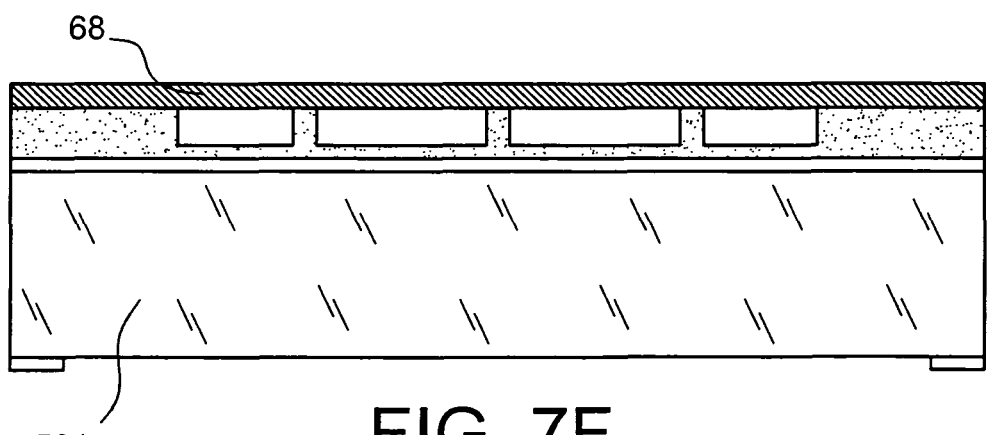

An oxide deposit 66 followed by planarisation of the oxide (for example by chemical mechanical polishing CMP) is used to obtain a plane surface for the remainder of the process (FIG. 7E).

Figure 7G:
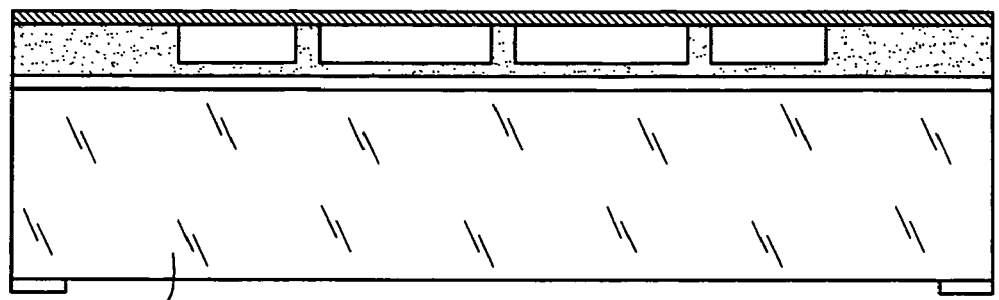

A poly-silicon layer 68 (about 1 to 2 µm thick) is deposited (FIG. 7F) and etched on the front face to make the actuators (FIG. 7G).

Figure 7H:
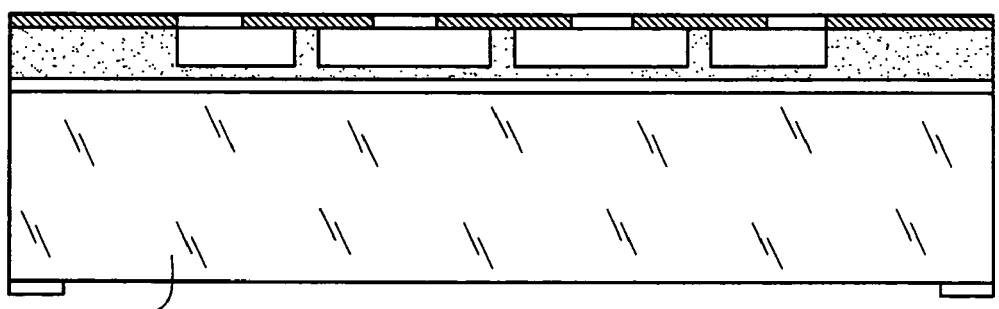

The sacrificial layer is then eliminated by HF etching of the oxide (FIG. 7H).

The substrate 503 is then etched on the back face (FIG. 7I) to expose the membrane 52 and the layer 502.

Figure 7I:
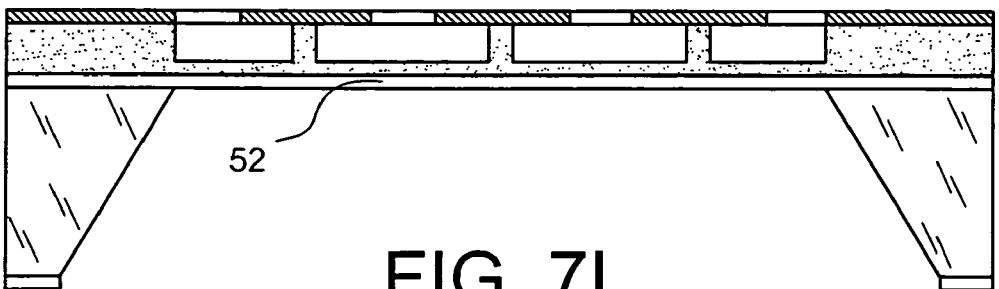

For a membrane 52 with a diameter of more than 10 mm and a thickness of less than 5 µm, it is preferable to oxidise the actuators made on the front face before the step in FIG. 7I, with the same oxide thickness as for layer 502, so as to balance mechanical stresses on this membrane during etching of the back face.

The oxide is then removed from the front face (FIG. 7J) and the back face.

Figure 7J:
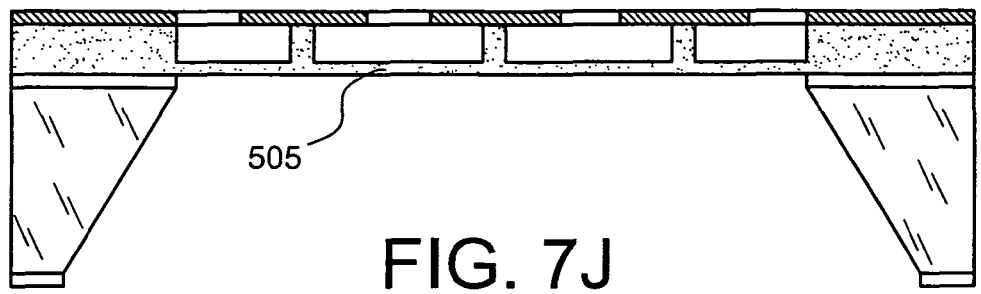

Dry etching of membranes on the back face is used to make the optical membranes; thus, the buried oxide 502 of the SOI may for example be etched in HF (FIG. 7J). A metallic deposit on the back face 505 of the membrane obtained by etching is used to form a reflecting surface.

Figure 8:
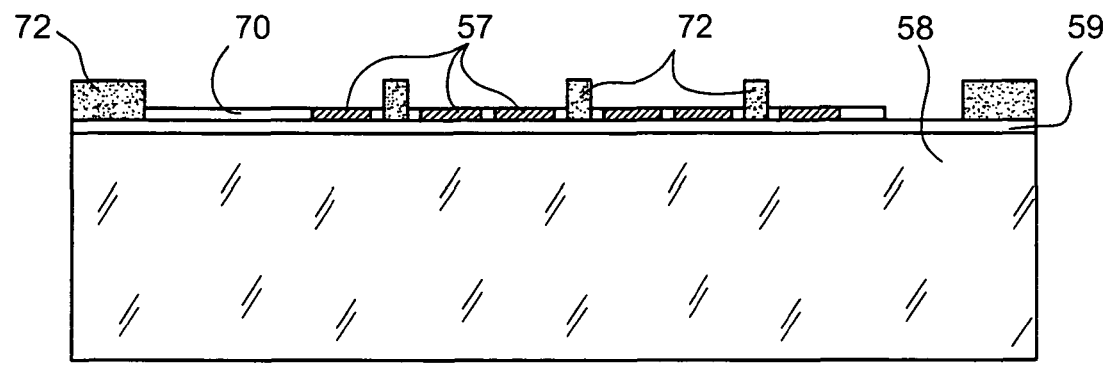
FIG. 8 is a cross-sectional view of a structure of the device according to the embodiment depicted in FIG. 1.

As shown in FIG. 8, electrodes 57 made of metal and tracks 70 and addressing pads (not shown in FIG. 8) are made on another substrate 58 (for example silicon) provided with an insulating layer 59 (for example 1 µm of thermal oxide). An insulating material is then deposited everywhere and is then etched at the addressing pads. Stops 72 are made to support the optical membrane and the actuators.

The 2 substrates or elements thus formed are then assembled to form a component. The assembly may be held mechanically by means of glue dabs around the periphery.

The assembly may be made component against component or substrate against substrate: in other words, several components located on the same substrate can be assembled in a single operation, or each component can be cut out in advance and components can be assembled one by one.

The result is then a device identical to that shown in FIG. 1.

If the semiconducting material of the layer 501 used to form the membrane 52 is monocrystalline silicon, the result is very good mechanical behaviour of this membrane, and also low roughness (peak-to-peak amplitude less than 100 nm) and very good flatness. Impression effects are limited.

Figure 9:
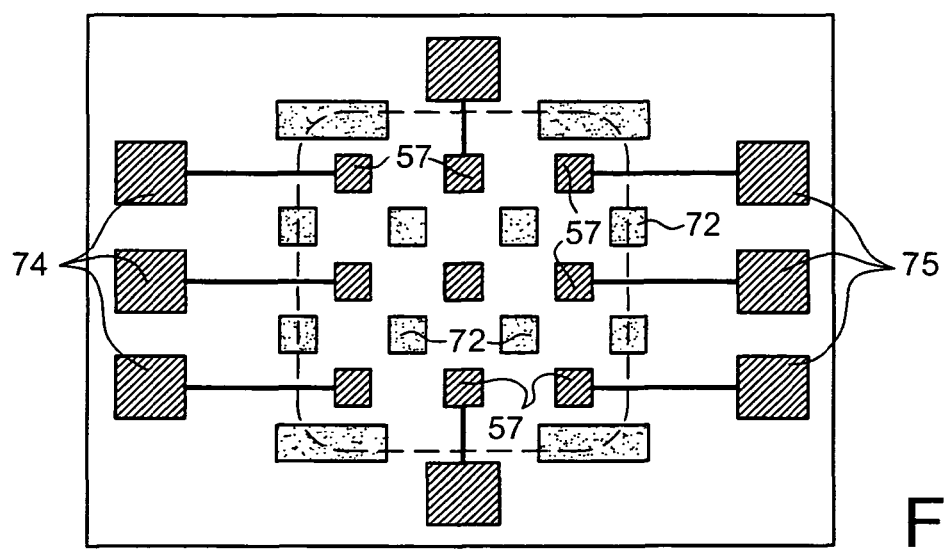
FIG. 9 is a top view of the device according to the embodiment depicted in FIG. 1.

Electrical connections 74, 75 can then be made laterally as shown in FIG. 9, which shows a top view of the device.

These fixed electrodes can then be connected to power supply means.

The example that has just been described relates to an embodiment made from an SOI substrate.

Figure 10A:
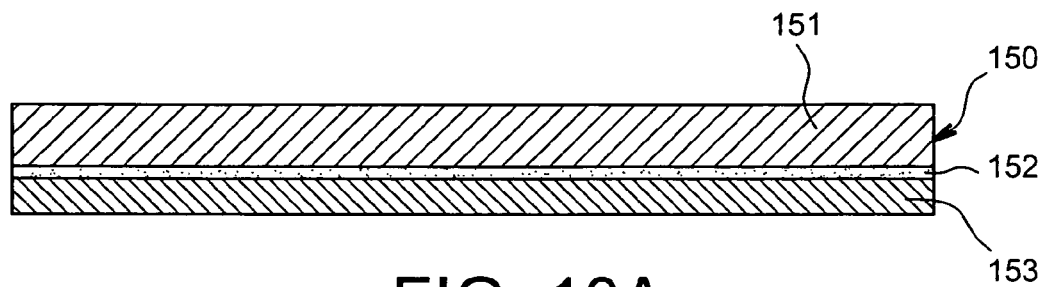
FIG. 10A-B is a cross-sectional view of an initial component according to an alternative embodiment.

According to another embodiment shown in FIG. 10A, an initial substrate 150 is made of silicon or GaAs.

It is doped so as to comprise two lateral zones 151, 153 doped using a first type of doping, surrounding an intermediate zone or layer 152 doped using a second type of doping.

The two layers or zones 153 and 152 have a total thickness of about 10 µm to 30 µm, for example 20 µm.

Advantageously, the order of magnitude of the difference in doping between the first and second doping is $10^7$ cm$^{-3}$.

For example, the order of magnitude of the first doping is $10^{20}$ to $10^{21}$ cm$^{-3}$ and the second doping is about $10^{14}$ cm$^{-3}$.

Figure 10B:
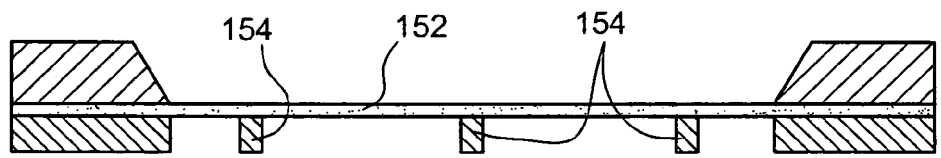

The different doped zones make selective etching possible: the first etching step in the layer 153 is used to make the pads 154. Zone 151 is then etched to expose a membrane in the layer 152 (FIG. 10B).

Once again, part of the component was formed on which a layer of activation means can be formed, or that can be assembled with a substrate-activation means assembly, like that shown in FIG. 6. The pads 154 and the membrane formed in the layer 152 are actually made from the same material, although the two zones are doped differently and there is no connecting element between the pads and the membrane. Once again, this avoids problems that arise with techniques according to prior art, namely problems of pad impression and bad flatness or roughness.

FIGS. 11A to 11E show other steps for this embodiment.

Firstly (FIG. 11A), a silicon substrate 151 is made or selected. It is p$^{++}$ doped, for example to $10^{21}$ cm$^{-3}$.

Figure 11A:
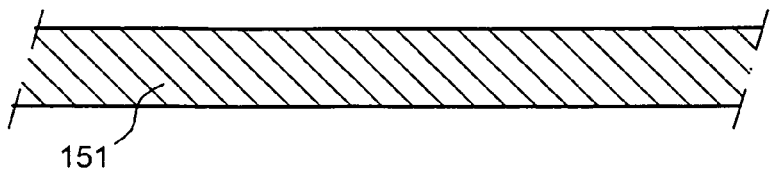
FIGS. 11A-E show steps in the production of the device according to the alternative embodiment.
Figure 11B:
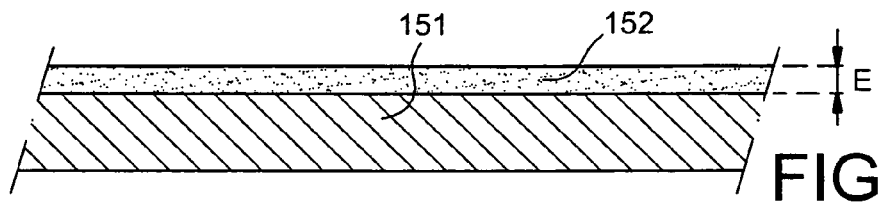
Figure 11C:
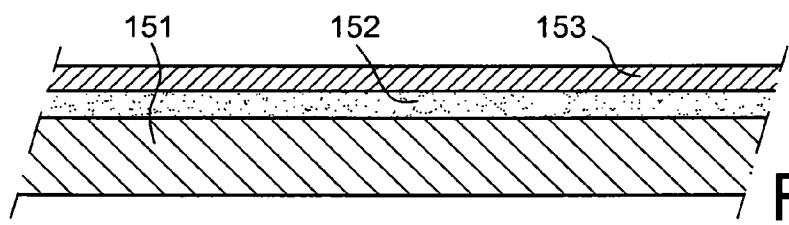
Figure 11D:
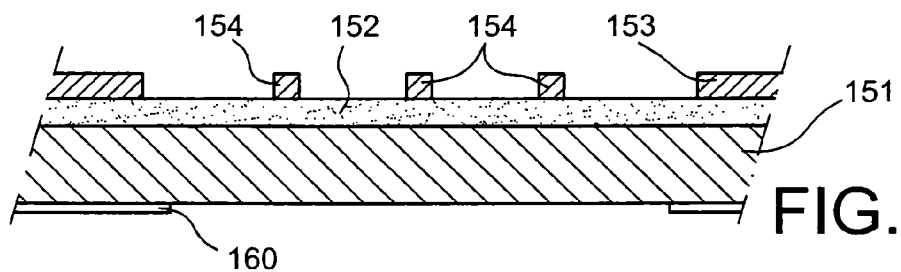
Figure 11E:
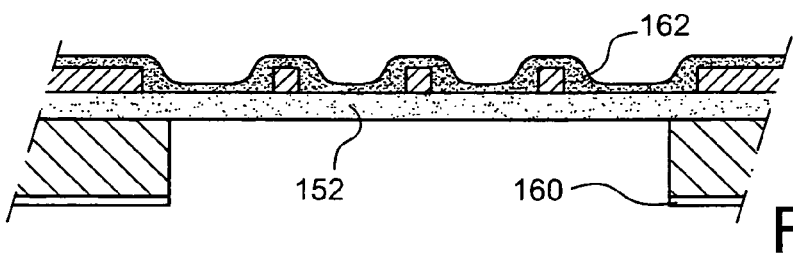

The next step is to perform a first epitaxy of a layer 152 with thickness E equal to about 20 µm, for example between 10 µm and 30 µm (FIG. 11B). This silicon layer 152 is p$^-$ doped. For example, the doping agent may be boron.

A second epitaxy step (FIG. 1C) is used to grow a p$^{++}$ silicon layer 153, for example to $10^{21}$ cm$^{-3}$.

The result is then a structure similar to that described above with reference to FIG. 10A.

Pads 154 are then etched in the layer 153, for example by a wet chemical process, particularly by a mix of HNA (mix of sulphuric acid H2SO4, hydrofluoric acid HF, and HNO$_3$).

Finally (FIGS. 11D and 11E), a protection layer 162 is deposited on the layer 153 and the pads 154, a mask 160 is positioned on the back face and the component is etched on the back face by HNA wet etching so as to expose a membrane in the layer 152.

The component obtained is similar to that in FIG. 10B, and can then be assembled for example with a substrate like that shown in FIG. 6. According to one variant, a layer of mobile electrodes 156 is made on the layer 153 and the pads 154, the assembly then being assembled with a substrate like that shown in FIG. 4E.

Figure 12:
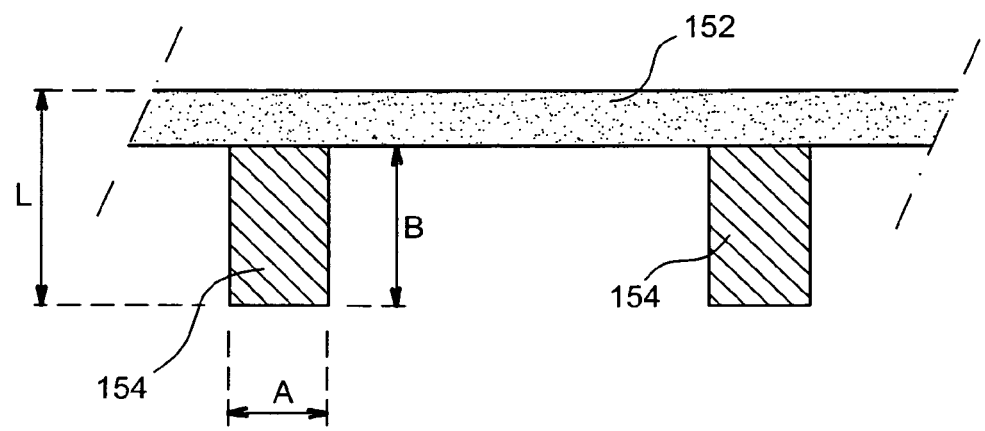
FIG. 12 shows a magnified cross-sectional view of a portion of pads and a membrane according to the alternative embodiment.

FIG. 12 shows a magnification of two pads 154 and a portion of the membrane 152. These pads are the same as those in the previous embodiment, but the following considerations can be applied to other embodiments.

According to the invention, the thickness L of the pads+ membrane assembly may for example be between 10 µm and 30 µm, for example about 20 µm regardless of the envisaged embodiment. Due to the use of an etching technique, the ratio between the height B of the pads and their width A, as shown in FIG. 12, is less than 20. If B is between 5 µm and about 15 µm, A could be fairly small, for example of the order of 1 µm or between 0.5 and 1.5 µm. The result is that the flexibility of the membrane with a thickness of between 1 µm or 5 µm and 10 µm is hardly affected by the presence of pads on one of its sides. For example, the pads may be at a spacing of about 500 µm.

Therefore the invention can be used to make small patterns. Therefore the optical impression of the device is minimal which gives it an excellent quality, unlike patterns that can be obtained by etching in thick substrates, for example with a thickness of about 200 µm. According to the invention L is much smaller than 200 µm because it is not equal to the total thickness of the substrate but only a fraction of this substrate.

The invention is applicable to the field of adaptive optics, or to the manufacture of micro-mirrors.

High power is not necessary for the optical part of a scanner or beam deviation micro-mirror, but it can be important to produce a significant angle.

The optical mechanical part can also be chosen to be very rigid so as not to be deformed and the mobile part may be chosen to be flexible to satisfy the requirements of the actuator.

The invention claimed is:

1. A method for manufacturing an actuation system for an optical component from a substrate, the method comprising:
   etching a first face of said substrate to form pads,
   etching a second face of said substrate to expose a same material as that comprising the pads, thereby exposing a flexible or deformable membrane made of the same material as the pads, and
   producing an actuator to actuate the pads and membrane.

2. The method according to claim 1, wherein said membrane and said pads have a total thickness less than 30 µm.

3. The method according to claim 1, wherein said membrane and said pads have a total thickness between 5 µm and 15 µm.

4. The method according to claim 1, wherein said substrate comprises a semiconducting material or glass, and is provided with a surface layer of semiconducting material or nitride in which the pads and membrane are etched.

5. The method according to claim 1, wherein said substrate comprises an SOI substrate comprising a surface layer of silicon, an insulating layer and a substrate, the pads and the membrane being made in the surface layer of silicon.

6. The method according to claim 1, wherein said substrate comprises a silicon substrate covered by an insulating layer and a layer of polysilicon, the pads and the membrane being made in the insulating layer or polysilicon layer.

7. The method according to claim 1, wherein said substrate comprises a silicon substrate doped on two sides, the membrane and the pads being made in portions that are doped differently from each other.

8. The method according to claim 1, wherein the actuator is electrical, magnetic, thermal, or piezo-electric.

9. The method according to claim 1, wherein the actuator is electrical and comprises one or several mobile electrodes, connected to said pads, and one or several fixed electrodes.

10. The method according to claim 1, wherein the actuator is magnetic and comprises one or several mobile coils or magnets, connected to the pads of the device, and one or several fixed magnets or coils.

11. The method according to claim 1, further comprising a step for making a first part of the actuator on the pads.

12. The method according to claim 11, further comprising an assembly step with a second substrate on which a second part of the actuator is made, which cooperates with the first part to actuate said pads and said membrane.

13. The method according to claim 1, wherein the actuator is produced in an assembly step of said membrane and pads with a second substrate which includes motivating portions.

14. The method according to claim 1, wherein said pads have a width or a width base less than 2 µm.

15. The method according to claim 1, wherein said pads have a height/width ratio less than 20.

16. The method for making an optical component comprising production of an actuation system according to claim 1, further comprising formation of a reflecting surface on the membrane.

17. The method according to claim 1, wherein said membrane has a thickness of between 1 µm and 5 µm.

18. The method according to claim 1, wherein said substrate comprises a silicon substrate covered by a nitride layer, the pads and the membrane being made in the nitride layer.

19. The method according to claim 12, further comprising etching the second substrate to form one or more stops to support the pads and the membrane.

20. The method according to claim 9, wherein the one or several mobile electrodes laterally protrude from respective ends of said pads.

21. A method for manufacturing an actuation system for an optical component from a substrate, the method comprising:
   etching a first face of the substrate to form pads,
   etching a second face of the substrate to expose a same material as that comprising the pads, thereby exposing a flexible or deformable membrane made of the same material as the pads, and
   producing an actuation means for actuating the pads and membrane.

22. The method according to claim 21, wherein the substrate comprises a semiconducting material or glass, and is provided with a surface layer of semiconducting material or nitride in which the pads and membrane are etched.

23. The method according to claim 21, wherein the substrate comprises an SOI substrate comprising a surface layer of silicon, an insulating layer and a substrate, the pads and the membrane formed in the surface layer of silicon.

24. The method according to claim 21, wherein the substrate comprises a silicon substrate covered by an insulating layer and a layer of polysilicon, the pads and the membrane formed in the insulating layer or polysilicon layer.

25. The method according to claim 21, wherein said substrate comprises a silicon substrate covered by a nitride layer, the pads and the membrane being made in the nitride layer.

26. The method according to claim 21, wherein the substrate comprises a silicon substrate doped on two sides, the membrane and the pads being formed in portions of the substrate that are doped differently from each other.

27. The method according to claim 21, wherein the actuation means is electrical, magnetic, thermal, or piezo-electric.

28. The method according to claim 21, further comprising disposing a first part of the actuation means on the pads.

29. The method according to claim 21, further comprising assembling a second substrate which includes a second part of the actuation means that cooperates with the first part to actuate the pads and the membrane.

* * * * *